United States Patent [19]
Agi

[11] Patent Number: 6,127,956
[45] Date of Patent: Oct. 3, 2000

[54] POST-CONVERSION SYSTEM FOR AN ANALOG-TO-DIGITAL CONVERTER WHICH SETS AN ADDED BIT OF RESOLUTION IF AN INTERMEDIATE SAMPLE IS WITHIN A THRESHOLD

[75] Inventor: Iskender Agi, San Mateo, Calif.

[73] Assignee: Exar Corporation, Fremont, Calif.

[21] Appl. No.: 09/108,755

[22] Filed: Jul. 1, 1998

[51] Int. Cl.⁷ ..................................... H03M 1/20
[52] U.S. Cl. ........................................ 341/131; 348/619
[58] Field of Search .................................. 341/110, 131, 341/155; 348/619

[56] References Cited

U.S. PATENT DOCUMENTS

| | | | |
|---|---|---|---|
| 4,127,873 | 11/1978 | Katagi | 348/390 |
| 4,303,943 | 12/1981 | May | 348/616 |
| 4,334,237 | 6/1982 | Reitmeier et al. | 348/619 |
| 4,654,634 | 3/1987 | Thong et al. | 341/131 |
| 4,733,221 | 3/1988 | Ishii | 341/131 |

*Primary Examiner*—Howard L. Williams
*Attorney, Agent, or Firm*—Townsend & Townsend & Crew LLP

[57] ABSTRACT

Post processing of the converted digital bits from an ADC to provide one or more additional bits of resolution. The additional bits of resolution will be accurate for data which is locally correlated, such as image data. For a particular digital sample, a curve (such as a straight line) is fitted through adjacent samples to determine an expected value for the current sample. The actual digital sample is compared to the expected value to determine whether it is within a threshold of the expected value. The value of an additional bit of resolution is set based upon whether the sample is within the threshold.

16 Claims, 2 Drawing Sheets

POST-CONVERSION SYSTEM FOR AN ANALOG-TO-DIGITAL CONVERTER WHICH SETS AN ADDED BIT OF RESOLUTION IF AN INTERMEDIATE SAMPLE IS WITHIN A THRESHOLD

BACKGROUND OF THE INVENTION

Analog-to-digital converters (ADC) convert an analog voltage into a binary representation in the form of digital bits. The resolution of the ADC is expressed in the number of digital bits into which the analog voltage is converted. Generally, the higher resolution that is desirable, the more precision required in the components of the analog-to-digital converter. For example, amplifying transistors, etc. need to have tighter tolerances and be very precise for enabling a meaningful least significant bit resolution.

The obvious tradeoff of tight tolerance, high precision components is the additional cost and difficulty of building an ADC. It would thus be desirable to have a higher precision ADC without requiring tight tolerance, high precision components.

SUMMARY OF THE INVENTION

The present invention provides post processing of the converted digital bits from an ADC to provide one or more additional bits of resolution. The additional bits of resolution will be accurate for data which is locally correlated, such as image data. For a particular digital sample, a curve (such as a straight line) is fitted through adjacent samples to determine an expected value for the current sample. The actual digital sample is compared to the expected value to determine whether it is within a threshold of the expected value. The value of an additional bit of resolution is set based upon whether the sample is within the threshold.

Preferably, a digital filter is used to interpolate the extra bit from adjacent samples from the output of the ADC. In one embodiment, the digital filter determines a best fit straight line through the sample position by averaging the (n+1) and (n−1) sample values. If the (n) digital sample is within one-half LSB of the average value, but not greater than the average value, an additional bit of resolution is set to 1. This recognizes that if the additional bit was available in the ADC, it would likely have caused the digital output to be closer to the straight line. If the value is already at the line or greater, the additional bit is set to 0 because otherwise the extra resolution bit would be putting the sample farther away from its expected value on the line. If the ADC value of the (n) sample is more than one-half LSB below the expected value on the line, this indicates that there is in fact an actual desired divergence from the expected line value at that point.

In one embodiment, the method can be repeated to generate two or more additional bits of resolution.

For a further understanding of the nature and advantages of the invention, reference should be made to the following description taking in conjunction with the accompanying drawings.

DESCRIPTION OF THE PREFERRED EMBODIMENT

Figure 1:
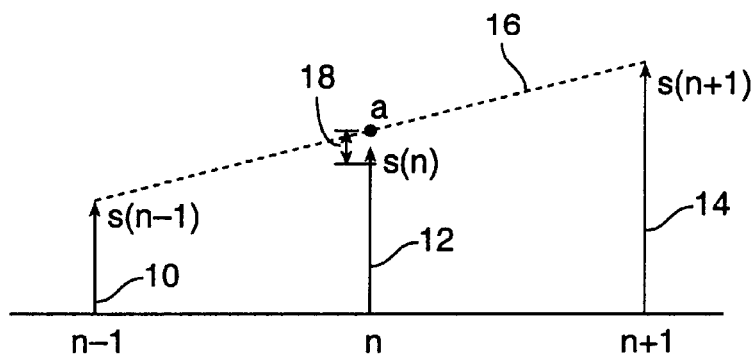
FIG. 1 is a graph illustrating the linear interpolation and threshold of one embodiment of the invention.

FIG. 1 illustrates by arrows 10, 12 and 14 three different sequential outputs of an ADC. The order of the samples is (n−1), n, (n+1). The value of each of these samples are, respectively, S(n−1), S(n), and S(n+1). In one embodiment of the invention, it is assumed that the actual analog value is varying linearly, and accordingly a line 16 is drawn between the values of the (n−1) and the (n+1) samples. The point of intersection where the n sample appears is labeled A.

A threshold 18 is set, and the value S(n) is compared to see if it is within the threshold. Preferably, an extra bit of resolution is set to 1 only if S(n) is within the threshold.

If S(n) is greater than A, adding another bit would only make it farther from expected straight line, and accordingly the extra bit would be set to 0. If S(n) is less than threshold 18, and threshold 18 is ½ LSB, it is clear that the actual sample is varying from the expected correlated value, and accordingly the additional bit of resolution is set to 0.

Figure 2:
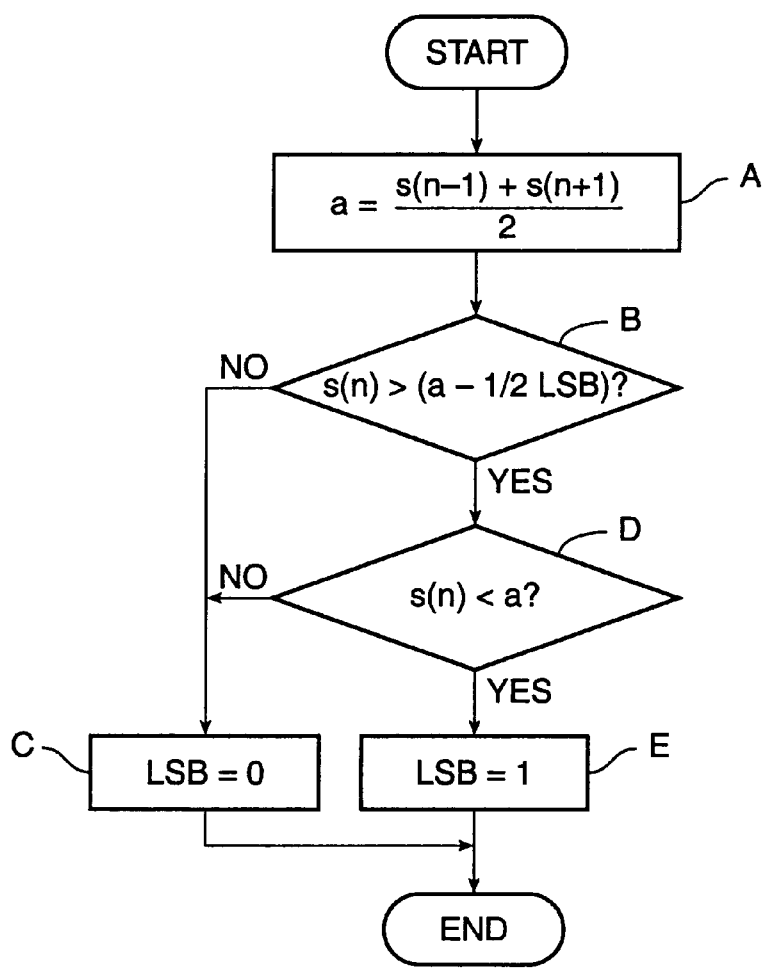
FIG. 2 is a flow chart illustrating one embodiment of the method of the invention.

FIG. 2 is a flow chart illustrating one method for doing the calculation as described in FIG. 1. First, the value of A is determined as the average of S(n−1) and S(n+1) in step A. Next (step B) the actual value of S(n) is compared to the lower end of threshold 18 of FIG. 1, to determine if it is greater than ½ LSB below A. If it is not, the additional bit, the LSB, is set to 0 (step C).

If S(n) is greater than this lower end of the threshold 18, is compared to see if it is less than A (step D). If it is not, then it is greater than the upper end of threshold 18, the LSB is set to 0 in step C. Otherwise, the LSB is set to 1 (step E) indicating that S(n) is within threshold 18.

Figure 3:
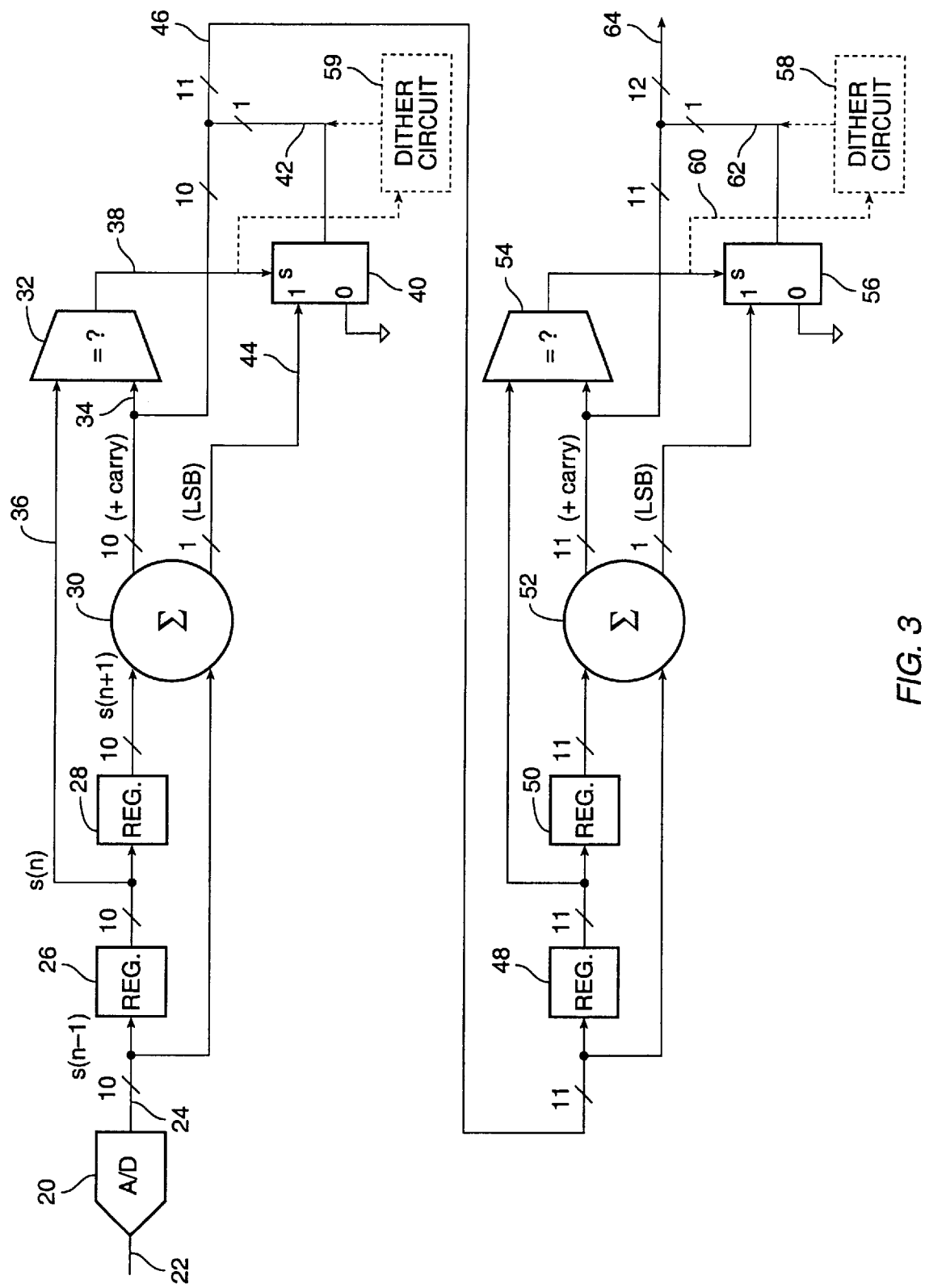
FIG. 3 is a block diagram of one embodiment of a circuit for providing two additional bits of resolution according to the invention.

FIG. 3 is a block diagram of one embodiment of logic for implementing the present invention. A 10 bit ADC 20 receives an analog input on line 22 and provides a 10 bit output [S(n−1)] on line 24. Previous outputs are stored in registers 26 and 28. Register 28 stores the S(n+1) value, while register 26 stores the S(n) value.

A summing circuit 30 sums together the S(n+1) and S(n−1) values. Because two 10 bit numbers are summed, the result can be an 11 bit number with carry. The upper 10 bits, including any carry, are provided to a comparator 32 on lines 34. These are compared to the S(n) bits on line(s) 36. By doing the sum and taking off the 10 most significant bits and shifting them down one, the result on line 34 is effectively the sum, divided by 2, of S(n+1) and S(n−1). If the values are not determined to be equal in comparator 32, this indicates that S(n) is not within the threshold of one-half LSB, and a control signal on line 38 causes a zero value from switch 40 to be provided as the additional bit of resolution on line 42.

If S(n) is determined to be equal to the result on line 34, the value of S(n) may be within the threshold and thus line 38 is activated to selected the LSB on line 44. If the LSB is 1, this indicates that the average divided by 2 is slightly high than S(n), and thus the one bit is passed through to line 42 to move the value S(n) closer to the average. If the value LSB on line 44 is zero, this indicates that the average is not greater than S(n) to this level of resolution, and accordingly, S(n) should not be incremented. Thus, the zero on line 44 is passed through to line 42 as the additional bit. The result is 11 bits of resolution on lines 46.

To produce another bit of resolution, the entire process can be repeated using a second set of registers 48, 50, and another summing circuit 52. In addition, another comparator 54 is used along with another switching circuit 56.

In some applications, it may be desirable to add a noise component to the additional bit of resolution when that bit is not within the threshold. This might be beneficial for a noisy environment, for instance. It may help with some calibration programs, making it easier for them to converge. Accordingly, FIG. 3 shows an optional dither circuit 58 controlled by optional control line 60 from comparator 54. When control line 60 indicates that the zero should be selected, instead the circuit 58 is selected to place a pseudo random number (1 or 0) on line 62 to give the twelfth bit in the output on lines 64. A dither circuit 59 could also be used for the 11th bit of resolution, if desired.

The present invention thus provides an improved resolution ADC which does not require the high precision components of a standard ADC of the same resolution. It has been determined that the maximum signal degradation is one code out of $2^n$. The invention can be realized using less silicon area than an equivalent implementation using analog components to directly generate the extra bits of resolutions from the analog signal. The invention improves the signal to noise ratio of ADCs for low frequency signals, without significantly degrading high-frequency signals. As noted above, these benefits are obtained for locally correlated signals, such as may be encountered in imaging data signals.

As will be understood by those skilled in the art, the present invention could be embodiment in other specific forms without departing from the essential characteristics thereof. For example, when an extra bit of resolution is determined for an S(n) signal, that extra bit could be used when that same signal is the subsequent S(n+1) signal, and is being used to determine the average. This could be used as an alternate method to generate two additional bits of resolution at one time, rather than repeating the steps for obtaining the first bit of resolution. In other embodiments, curves other than a straight line could be used, and using more than two samples to approximate such a curve could be involved in the calculation. Alternately, other threshold values could be used. Accordingly, the foregoing description is intended to be illustrative, but not limiting, of the scope of the invention which is set forth in the following claims.

What is claimed is:

1. A method of improving analog to digital conversion resolution, comprising:
   (a) determining a curve based on at least two digital samples;
   (b) determining whether an intermediate sample is within a threshold of said curve;
   (c) setting an additional bit of resolution to one if said intermediate sample is within said threshold; and (d) otherwise setting said additional bit of resolution to zero.

2. The method of claim 1 wherein said curve is a straight line and an intersection of said straight line with a position of said intermediate sample is determined by averaging said two digital samples.

3. The method of claim 2 further comprising:
   setting said additional bit of resolution to one if said intermediate sample is within said threshold and is less than said average value; and
   otherwise setting said additional bit of resolution to zero.

4. The method of claim 2 wherein said threshold is between said average value and one half said additional bit of resolution less than said average value.

5. The method of claim 1 further comprising the step of adding dither to said additional bit when said intermediate sample is not within said threshold.

6. The method of claim 1 further comprising repeating steps (a)–(c) on a resulting digital sample with said additional bit of resolution to provide a second additional bit of resolution.

7. The method of claim 1 further comprising:
   summing an (n+1) and an (n−1) sample to produce a summed sample;
   trimming said summed sample by leaving off a LSB and including a carry to produce a trimmed sample;
   comparing said trimmed sample to an (n) sample; and
   if said trimmed sample and said (n) sample are not equal, setting said additional bit of resolution to zero, otherwise setting said additional bit of resolution to the value of said LSB of said summed sample.

8. An apparatus for improving analog to digital conversion resolution, comprising:
   an analog to digital converter having an n-bit output;
   a digital filter coupled to said n-bit output of said analog to digital converter; and
   an n+1 bit output of said digital filter.

9. The apparatus of claim 8 wherein said digital filter comprises:
   arithmetic logic configured to determine a curve based on at least two digital samples;
   comparison logic configured to determine whether an intermediate sample is within a threshold of said curve; and
   switching logic configured to set an additional bit of resolution based on whether said intermediate sample is within said threshold.

10. The apparatus of claim 9 wherein said curve is a straight line and an intersection of said line with a position of said intermediate value is determined by averaging said two digital samples.

11. The apparatus of claim 10 wherein:
    said switching logic is configured to set said additional bit of resolution to one if said intermediate sample is within said threshold and is less than said average value, and otherwise set said additional bit of resolution to zero.

12. The apparatus of claim 10 wherein said threshold is between said average value and one half said additional bit of resolution less than said average value.

13. The apparatus of claim 9 further comprising dither logic configured to add dither to said additional bit when said intermediate sample is not within said threshold.

14. The apparatus of claim 9 further comprising means for adding a second additional bit of resolution.

15. The apparatus of claim 9 further comprising first and second registers for storing two of said samples.

16. An apparatus for improving analog to digital conversion resolution, comprising:
    a summer configured to sum an (n+1) and an (n−1) sample to produce a summed sample;
    trimming said summed sample by leaving off a LSB and including a carry to produce a trimmed sample;
    a comparator configured to compare said trimmed sample to an (n) sample; and
    a switching circuit, controlled by said comparator, configured to set said additional bit of resolution to zero if said trimmed sample and said (n) sample are not equal, and otherwise set said additional bit of resolution to the value of said LSB of said summed sample.

* * * * *